United States Patent
Killmeier et al.

(10) Patent No.: US 6,834,937 B2
(45) Date of Patent: Dec. 28, 2004

(54) PRINTHEAD CORROSION PROTECTION

(75) Inventors: Eric Louis Killmeier, Louisville, KY (US); Paul Timothy Spivey, Lexington, KY (US); Sean Terrence Weaver, Lexington, KY (US); Gary Raymond Williams, Lexington, KY (US)

(73) Assignee: Lexmark International, Inc., Lexington, KY (US)

( * ) Notice: Subject to any disclaimer, the term of this patent is extended or adjusted under 35 U.S.C. 154(b) by 198 days.

(21) Appl. No.: 10/218,063

(22) Filed: Aug. 13, 2002

(65) Prior Publication Data

US 2004/0032468 A1 Feb. 19, 2004

(51) Int. Cl.$^7$ ................................ B41J 2/14; B41J 2/05
(52) U.S. Cl. .......................................... 347/50; 347/58
(58) Field of Search .......................... 347/47, 50, 58, 347/63, 87; 456/273.3, 275.5, 275.7

(56) References Cited

U.S. PATENT DOCUMENTS

| | | | |
|---|---|---|---|
| 5,422,667 A | 6/1995 | Daggs et al. | |
| 5,442,386 A | 8/1995 | Childers et al. | |
| 5,442,667 A | 8/1995 | Senski | |
| 5,953,032 A | 9/1999 | Haarz et al. | |
| 5,980,682 A | 11/1999 | Gibson et al. | |
| 6,227,651 B1 * | 5/2001 | Watts et al. | 347/50 |
| 6,241,340 B1 | 6/2001 | Watanabe et al. | |
| 6,244,696 B1 | 6/2001 | Tran et al. | |

* cited by examiner

*Primary Examiner*—Anh T. N. Vo
(74) *Attorney, Agent, or Firm*—Luedeka, Neely & Graham, P.C.

(57) ABSTRACT

A method for encapsulating electrical traces on a flexible circuit or TAB circuit and electrical connections between the flexible circuit or TAB circuit and a printhead substrate to inhibit ink corrosion thereof. The method includes applying a first adhesive to a first surface of the flexible circuit or TAB circuit. A second adhesive is applied to first surface of the flexible circuit or TAB circuit whereby the first and second adhesives effectively coat exposed portions of the traces and connections. The first and second adhesives are thermally curable epoxy compositions that are miscible with each other and the first adhesive has a first viscosity and first thixotropy index that is lower than a second viscosity second thixotropy index of the second adhesive. After applying the adhesive, the first and second adhesives are cured.

21 Claims, 4 Drawing Sheets

PRINTHEAD CORROSION PROTECTION

FIELD OF THE INVENTION

The invention relates to encapsulated electrical circuits for ink jet printheads and to improved encapsulating methods for protecting circuits for ink jet printheads.

BACKGROUND OF THE INVENTION

Ink jet printers continue to evolve as the technology for ink jet printing continues to improve to provide higher speed and higher quality printers. The improvement in speed and quality does not come without a price, however. The printheads of such printers are more costly to manufacture and thus there is a movement to longer life permanent or semi-permanent printheads that are used in conjunction with replaceable ink cartridges.

With the movement to longer life permanent or semi-permanent printheads, there arises a need for improved methods of protecting the electrical components, particularly the flexible circuit or tape automated bonding (TAB) circuit traces or TAB beams and the electrical connections between the TAB beams and the substrate chips from ink corrosion. During the life of the printheads, components of the printhead are subjected to mechanical, thermal, electrical, and chemical stresses. In particular, the TAB circuit or flexible circuit connections to the printhead chip may fail due to ink corrosion of the connections. Therefore it is important to adequately protect the electrical connections from the ink, otherwise electrical shorts or inadequate electrical signals to the printhead could result.

One method for protecting ink jet printheads includes causing a die bond adhesive used to attach the printhead chip to the printhead body to flow up along the sides of the chip to contact the back side of an electrical circuit attached to the chip. An epoxy encapsulant is then applied to the top side of the chip after curing the die bond adhesive. Because of slight production variations, the method is inadequate to assure that sufficient die bond adhesive to protect the electrical circuit has flowed up along side of the chip for each printhead.

Another method includes applying a first epoxy layer to the back side of the circuit assembly after attaching the electrical circuit to the printhead chip. This epoxy layer is cured and the chip is attached to a printhead body using a die bond adhesive. A second epoxy material is applied to the top side of the circuit assembly and cured after curing the die bond adhesive. In this assembly technique, the electrical leads are sandwiched between two cured epoxy layers creating an interface at the crucial area joining the two layers. This epoxy interface is prone to delamination thereby permitting ink to flow between the layers and contact the electrical connections.

Despite advances made in the art of bonding electrical circuits to pen bodies, there remains a need for improved methods that provide enhanced protection of electrical components and greater flexibility with regard to manufacturing processes.

SUMMARY OF THE INVENTION

With regard to the foregoing and other object and advantages, the invention provides a method for encapsulating electrical traces on a flexible circuit or TAB circuit and electrical connections between the flexible circuit or TAB circuit and a printhead substrate to inhibit ink corrosion thereof. The method includes applying a first adhesive to a first surface of the flexible circuit or TAB circuit. A second adhesive is applied to first surface of the flexible circuit or TAB circuit whereby the first and second adhesives effectively coat exposed portions of the traces and connections on the first surface and on a second surface of the flexible circuit or TAB circuit. The first and second adhesives are preferably thermally curable epoxy compositions that are miscible with each other and the first adhesive has a first viscosity and first thixotropy index that is lower than a second viscosity and second thixotropy index of the second adhesive. After applying the adhesives, the first and second adhesives are cured.

In another aspect the invention provides a printhead for an ink jet printer. The printhead includes a cartridge body containing at least one printhead substrate adhesively attached to the cartridge body and flexible circuit or TAB circuit electrically connected to the printhead substrate. The flexible circuit or TAB circuit contains electrical traces and electrical connections from the traces to bond pads on the printhead substrate. A thermally cured encapsulant encapsulates the connections and traces. The encapsulant is derived from first and second adhesives. The first adhesive is a thermally curable epoxy composition having a first viscosity and first thixotropy index sufficient for flow of the first adhesive between the connections and traces from a first surface of the flexible circuit or TAB circuit to a second surface of the flexible circuit or TAB circuit. The second adhesive is a thermally curable epoxy composition miscible with the first adhesive and having a second viscosity and second thixotropy index whereby flow of the second adhesive through the connections and traces is substantially inhibited.

An advantage of the compositions and methods according to the invention is that ink jet pens may be assembled and critical electrical connections protected with an encapsulant that is less prone to delamination under mechanical, chemical, thermal or electrical stresses since both adhesive materials used as an encapsulant are cured at substantially the same time. This is particularly important for protecting critical electrical components in permanent or semi-permanent printheads. Another advantage of the invention is that by using adhesives having different viscosities and thixotropy indices, both surfaces of the flexible circuit or TAB circuit can effectively be protected from ink corrosion by applying the adhesives to only one surface of the flexible circuit or TAB circuit. The adhesives are also adaptable to application to the printhead after the printhead substrate has been fixedly attached to the cartridge body thus eliminating the need to apply an adhesive or encapsulant to the back side of a flexible circuit or TAB circuit prior to attaching the printhead substrate and flexible circuit to a cartridge body.

Thixotropic adhesives are adhesives which exhibit a time-dependent viscosity. In other words, the adhesives are substantially liquid materials which gell on standing, then thin out when stirred and again gell when the stirring stops. For the purposes of this invention, the "thixotropy index" of an adhesive is a ratio of the viscosities of the adhesive at two different shear rates determined using a BROOKFIELD model HBT viscometer.

BRIEF DESCRIPTION OF THE DRAWINGS

Further advantages of the invention will become apparent by reference to the detailed description when considered in conjunction with the figures, which are not to scale, wherein like reference numbers indicate like elements through the several views, and wherein.

DETAILED DESCRIPTION OF THE INVENTION

Figure 1:
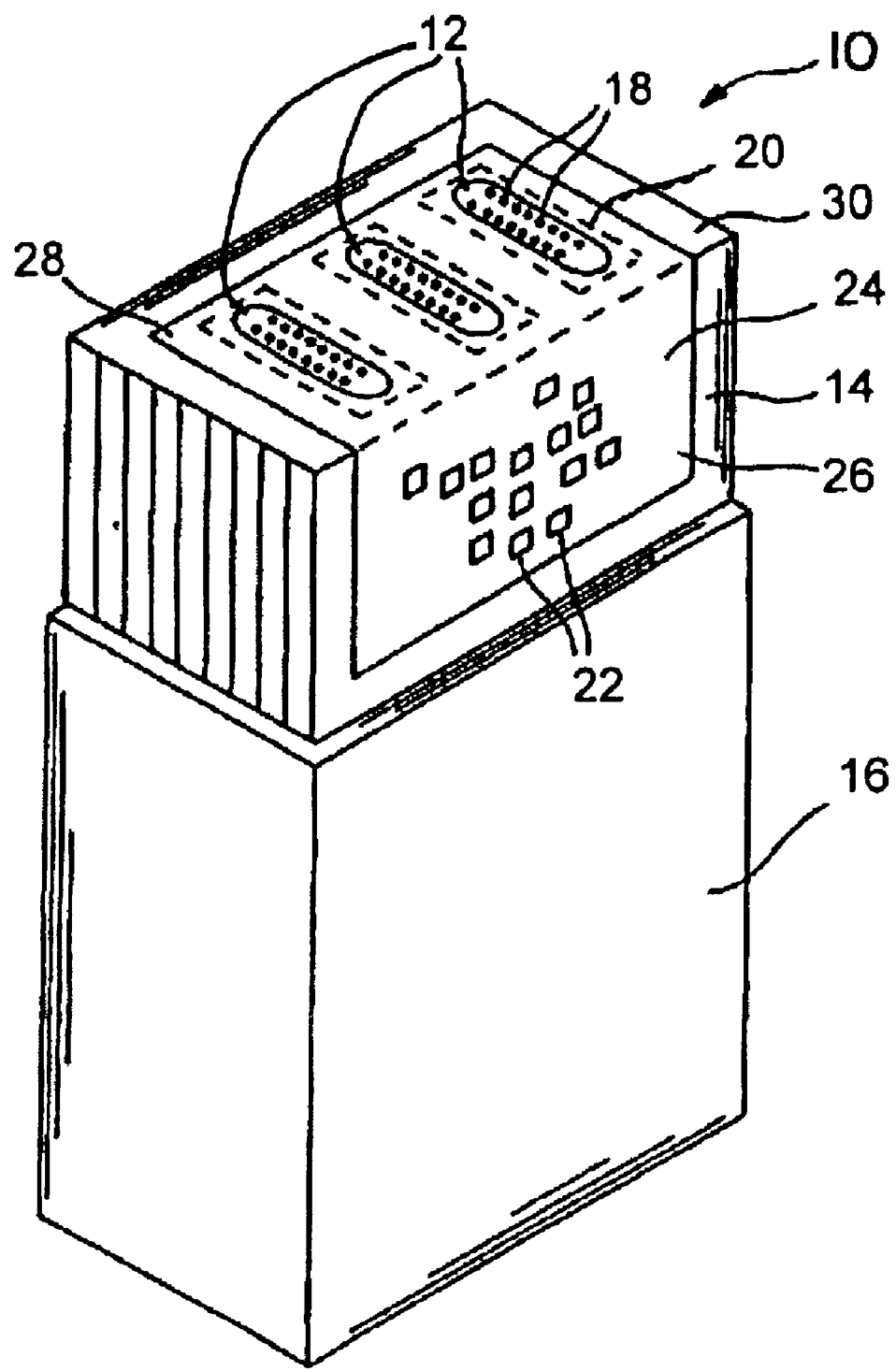
FIG. 1 is a perspective view of an ink jet printhead and cartridge body according to the invention.

With reference to FIG. 1, there is shown, in perspective view, an ink jet pen 10 including printheads 12 attached to a cartridge body 14. An ink cartridge 16 containing one or more inks is fixedly or removably attached to the cartridge body for feeding ink to the printheads 12 for ejection of ink toward a print media from nozzle holes 18 on nozzle plates 20. Each ink jet pen 10 may contain a single color ink and a single printhead 12, such as black, cyan, magenta or yellow or may contain multiple colors of ink for ejection by multiple printheads 12 as shown in FIG. 1. The number of printheads and color thereof is not critical to the invention. For illustrative purposes only, the ink jet pen 10 contains three printheads 12 for ejecting three different colors of ink, however the invention is applicable to a pen containing one or more printheads.

In order to control the ejection of ink from the nozzle holes 18, each of the printheads 12 is electrically connected to a print controller in the printer to which the pen 10 is attached. Connections between the print controller and the pen are provided by contact pads 22 which are disposed on a first portion 24 of a flexible circuit or tape automated bonding (TAB) circuit 26. Flexible circuits and TAB circuits are resilient polymeric films such as polyimide films 26 which contain electrical traces thereon for conducting electrical signals from a source to a device such as a printhead chip connected to the traces of the flexible or TAB circuit 26. A second portion 28 of the flexible circuit or TAB circuit 26 is disposed on operative side 30 of the cartridge body 14. The reverse side of the flexible circuit or TAB circuit 26 typically contains electrical traces which provide electrical continuity between the contact pads 22 and the printheads 12 for controlling the ejection of ink from the printheads. Most portions of the electrical traces on the reverse side of the flexible circuit or TAB circuit 26 are protected by a pressure sensitive adhesive 32 that is used to attach the flexible circuit or TAB circuit to the cartridge body 14. Electrical TAB bond or wire bond connections are made between the electrical traces and the individual printheads as described in more detail below.

Figure 2:
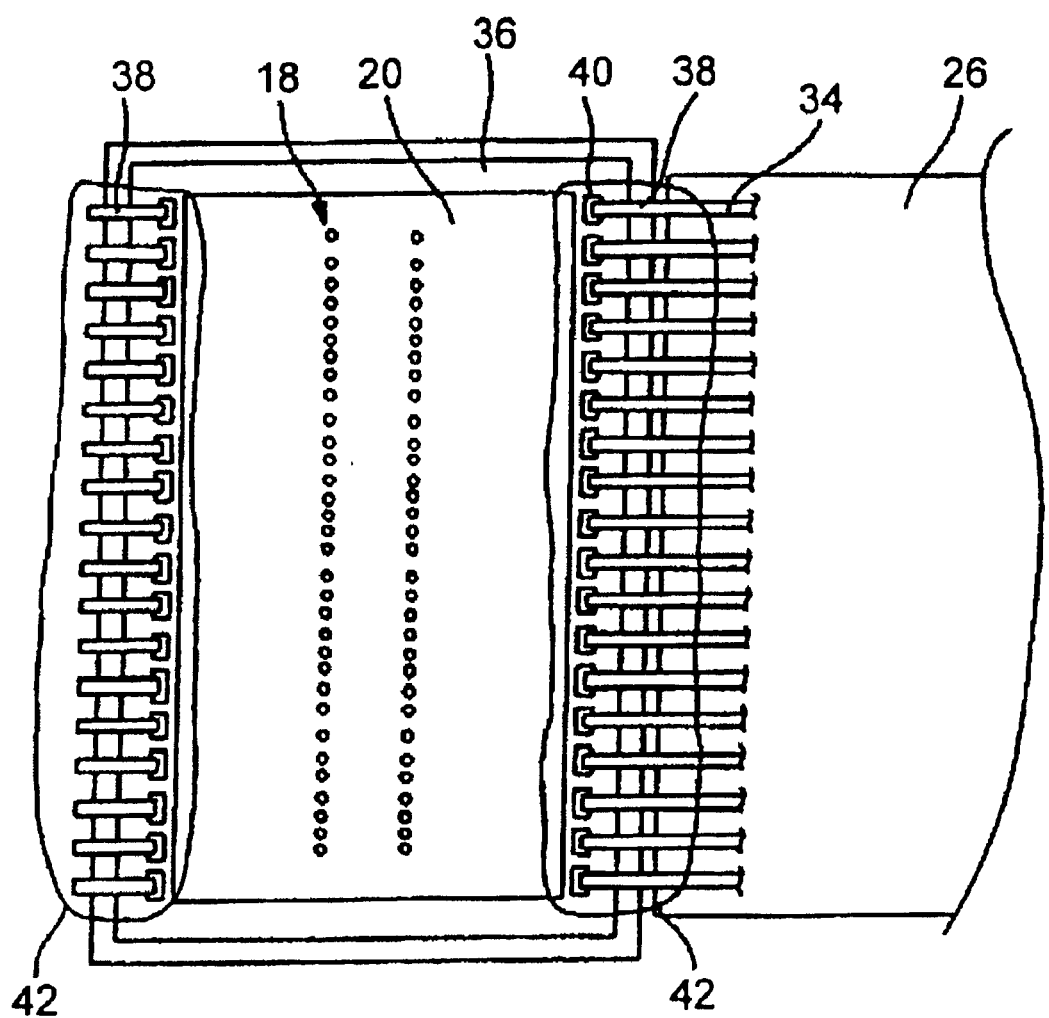
FIG. 2 is a plan top view of a portion of an ink jet printhead containing an encapsulant material according to the invention.
Figure 3:
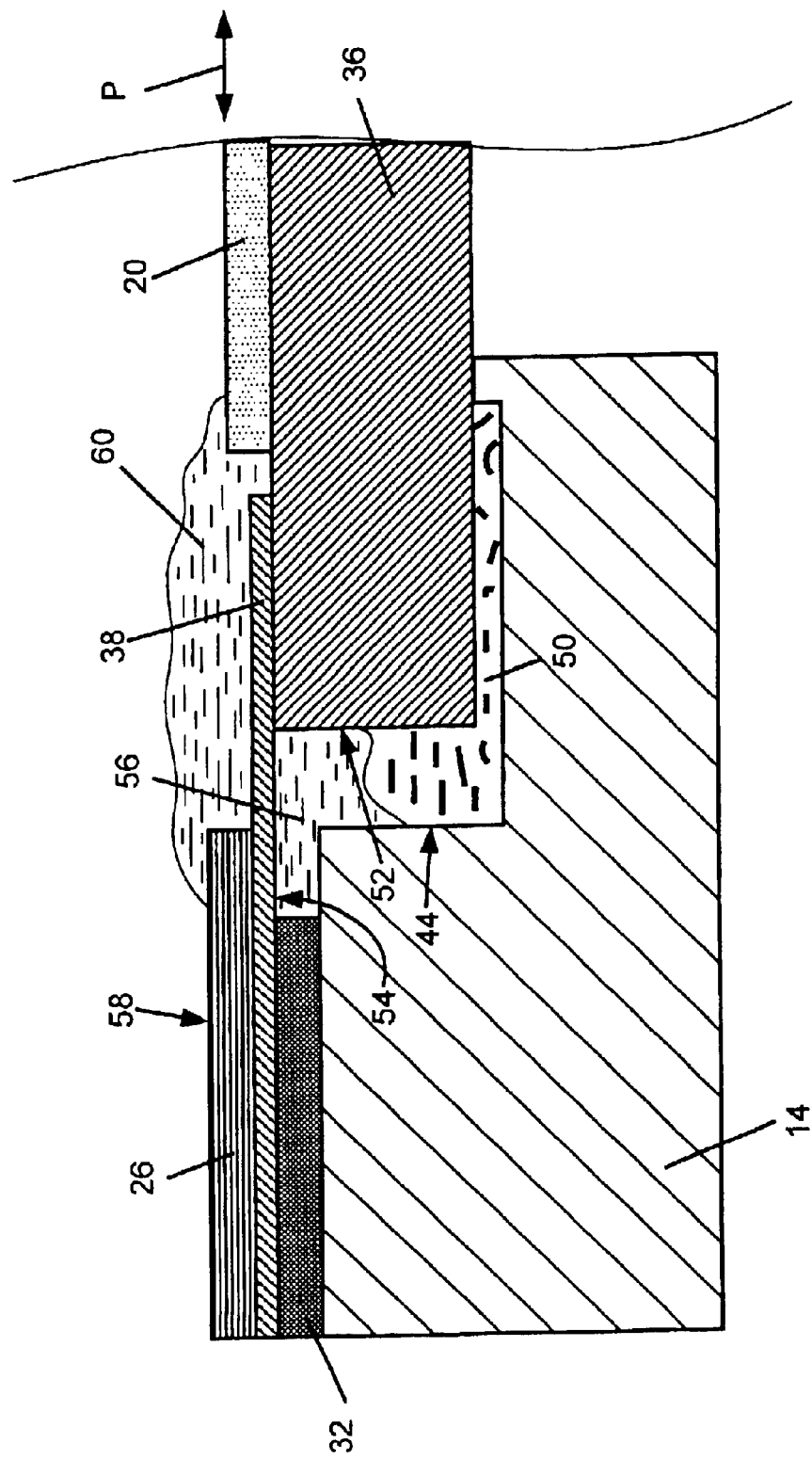
FIG. 3 is a cross-sectional side view of a portion of an ink jet printhead according to the invention.

Connections between the flexible circuits or TAB circuits and the printheads 12 are shown in detail by reference to FIGS. 2 and 3. As described above, the flexible or TAB circuits 26 contain electrical traces 34 which are electrically connected to a semiconductor chip 36. The chip 36 contains resistors and/or other electronic devices such as piezoelectric devices for inducing ejection of ink through the nozzle holes 18 of the nozzle plate 20 toward a print media. A preferred ink ejection device according to the invention is a resistor for thermal ink jet printing. The electrical traces 34 are connected through electrical leads 38 to bond pads 40 on the semiconductor chip 36 either by TAB bonding or wire bonding techniques. An epoxy encapsulating material 42 is applied to the electrical leads 38 and bond pads 40 to protect the leads and connections from ink corrosion.

As shown in FIG. 3, the semiconductor chip 36 is attached to the cartridge body 14, preferably in a chip pocket 44. Prior to attaching the chip 36 to the cartridge body 14, one of the nozzle plates 20 is adhesively attached to the chip 36. The assembly provided by the nozzle plate 20 attached to the chip 36 is referred to herein as the chip/nozzle plate assembly 20/36 (FIG. 3). The electrical connections between the TAB circuit 26 and the chip 36 may be made before or after attaching the nozzle plate 20 to the chip 36.

The adhesive used to attach the nozzle plate 20 to the chip 36 may be a heat curable adhesive such a B-stageable thermal cure resin, including, but not limited to phenolic resins, resorcinol resins, epoxy resins, ethylene-urea resins, furane, resins, polyurethane resins and silicone resins. The adhesive is preferably cured before attaching the chip 36 in the chip pocket 44 of the cartridge body 14 and the adhesive preferably has a thickness ranging from about 1 to about 25 microns.

After bonding the nozzle plate 20 and chip 36 together, the chip/nozzle plate assembly 20/36 is attached to the cartridge body 14 in chip pocket 44 using a die bond adhesive 50. The die bond adhesive 50 used to attach the chip/nozzle plate assembly 20/36 to the chip carrier or cartridge body 14 is preferably an epoxy adhesive such as a die bond adhesive available from Emerson & Cuming of Monroe Township, N.J. under the trade name ECCOBOND 3193-17. In the case of a thermally conductive chip carrier or cartridge body 14, the die bond adhesive 50 is preferably a resin filled with thermal conductivity enhancers such as silver or boron nitride. A suitable thermally conductive die bond adhesive 50 is POLY-SOLDER LT available from Alpha Metals of Cranston, R.I. A preferred die bond adhesive 50 containing boron nitride fillers is available from Bryte Technologies of San Jose, Calif. under the trade designation G0063. The thickness of adhesive 50 preferably ranges from about 25 microns to about 125 microns.

It is preferred to provide excessive die bond adhesive 50 so that during the chip attachment step, the die bond adhesive 50 flows up along edges 52 of the chip 36 toward an underside or second surface 54 of the TAB circuit 26.

Once the chip/nozzle plate assembly 20/36 is attached to the cartridge body 14, the flexible circuit or TAB circuit 26 is attached to the cartridge body 14 preferably using a heat activated or pressure sensitive adhesive. Preferred pressure sensitive adhesives 32 include, but are not limited to, acrylic based pressure sensitive adhesives such as VHB Transfer Tape 9460 available from 3M Corporation of St. Paul, Minn. The adhesive 32 preferably has a thickness ranging from about 25 to about 200 microns.

In order to protect the bond pads 40 and wires or TAB bonds 38 from ink corrosion, a first adhesive 56 having a first viscosity and a first thixotropy index is applied to a first surface 58 of the flexible circuit or TAB circuit. The first adhesive 56 includes an epoxy resin or mixture of epoxy resins, an imidazole thermal curing agent, and an amount of fumed silica sufficient to provide a first viscosity in the range of from about 14,000 to about 20,000 centipoise (Brookfield DV-III with a #51 spindle at 0.5 rpm) and a first thixotropy index ranging from about 1 to about 2. A particularly preferred first adhesive 56 is available from Engineered Materials Systems, Inc. of Delaware, Ohio under the trade name designation 502-37.

The first viscosity and first thixotropy index of the first adhesive 56 enables the first adhesive 56 to flow between the electrical leads 38 down into the chip pocket 44 substantially filling any void between the die bond adhesive 50 and the second surface 54 of the flexible circuit or TAB circuit as shown in FIG. 3. A portion of the first adhesive 56 may also cover the first surface 58 of the flexible circuit or TAB circuit 26 to provide a location for mixing the first adhesive 56 with a second adhesive 60 described below.

Before the first adhesive 56 is cured, the second adhesive 60 which is miscible with the first adhesive 56 is applied to the first surface 58 of the flexible circuit or TAB circuit 26 to provide encapsulant 42 (FIG. 2). The second adhesive 60 also includes an epoxy resin or mixture of epoxy resins, and an imidazole thermal curing agent. An amount of fumed silica, less than about 15% by weight is included in the second adhesive. The fumed silica is sufficient to provide the second adhesive 60 with a second viscosity preferably in the range of from about 115,000 to about 125,000 centipoise (Brookfield DV-III at 0.5 rpm with a #51 spindle) and a second thixotropy index ranging from about 3 to about 5. A particularly preferred second adhesive 60 is available from Engineered Materials Systems, Inc. under the trade name designation 502-39-1. Because the second adhesive 60 has a viscosity and thixotropy index substantially higher than the viscosity and thixotropy index of the first adhesive 56, the second adhesive 60 remains substantially on the first surface 58 of the flexible circuit or TAB circuit 26, however, there is sufficient mixing between the two adhesives. Both the first and second adhesives 56 and 60 are preferably compatible with the ink used in the ink jet printer and preferably provide suitable corrosion protection from the ink for the printhead components.

After applying the first and second adhesives 56 and 60 to the first surface 58 of the flexible circuit or TAB circuit 26, the adhesive is cured by applying heat to the printhead. Curing temperatures are preferably in the range of from about 100° C. to about 150° C. At these temperatures, all of the adhesives used to assemble printhead may be cured at one time. In the alternative, only the first and second adhesives 56 and 60 are cured at the same time and the other adhesives are cured prior to curing the first and second adhesives 56 and 60. Temperatures lower than about 100° C. may require too long a cure time and temperatures above about 150° C. may cause unwanted deformation of the material used for the cartridge body 14. It is preferred that the cartridge body be made from a modified polyphenylene oxide/styrene composition, however, other materials may be used for the cartridge body 14.

Figure 4:
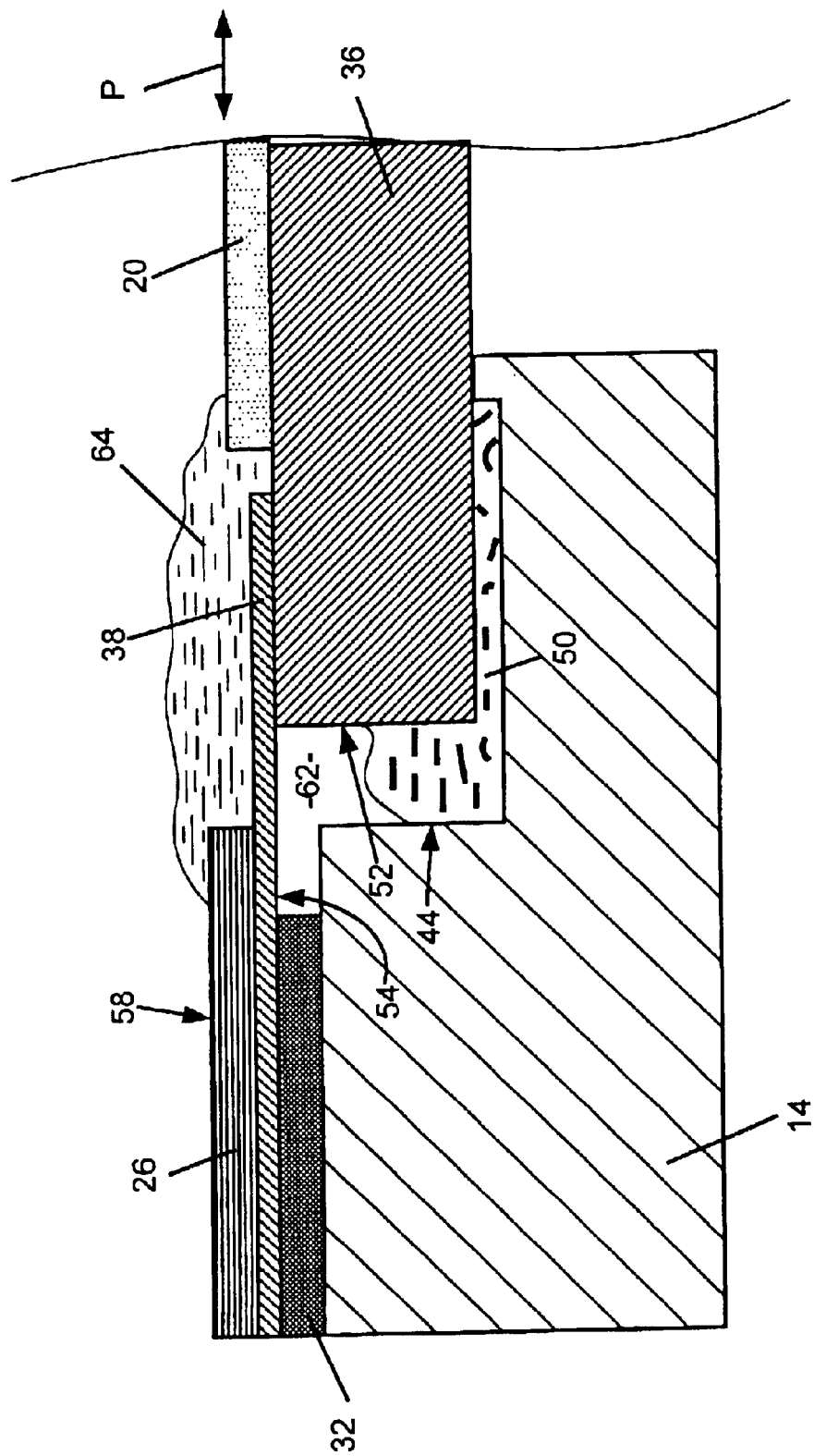
FIG. 4 is a cross-sectional side view of a portion of an ink jet printhead made according to a conventional process.

FIG. 4 illustrates the advantage of the invention over the use of conventional encapsulant materials. As shown in FIG. 4, a chip 36 is attached to a cartridge body 14 in a chip pocket 44 using a die bond adhesive 50. The die bond adhesive 50 is preferably used in excess so that a portion of the die bond adhesive 50 flows up toward the second surface 54 of the flexible circuit or TAB circuit 26 thereby protecting a portion of the edges 52 of the chip 36. As described above, because of manufacturing deviations, a portion of the chip edges 52 and the second surface of the flexible circuit or TAB circuit 26 remains unprotected providing a gap or air space 62 between the die bond adhesive 50 and the second surface 54 of the flexible circuit or Tab circuit. This gap or air space 62 represents an unprotected area which is susceptible to ink corrosion of the electrical traces or TAB beams 34. A conventional encapsulant material 64 typically has a viscosity which is insufficient to permit flow between the electrical leads 38 in order to fill the gap or air space 62. As set forth above, the invention is effective to substantially eliminate the gap or air space 62 by providing the first adhesive 56 having a lower viscosity than the second adhesive 60 so that the first adhesive 56 readily flows between the leads 38 to substantially fill any gap or air space 62 not filled by the die bond adhesive 50.

As described above, particularly preferred adhesives 56 and 60 according to the invention are thermosettable epoxy adhesives. Such adhesive contain about 60 wt. % of a di-functional epoxy material, from about 20 to about 30 wt. % modified epoxy material. The di-functional epoxy material component of the formulation is preferably selected from di-functional epoxy compounds which include diglycidyl ethers of bisphenol-F (e.g. those available under the trade designations "EPON 828", available from Resolution Performance Products of Houston, Tex., "DER-354", available from Dow Chemical Company of Midland, Mich. A particularly preferred difunctional epoxy resin is a bisphenol-F/epichlorohydrin epoxy resin available from Shell Chemical Company of Houston, Tex. under the trade name EPON resin 828. The other epoxy component of the adhesive formulations is preferably a modified epoxy resin which comprises a minor portion of the adhesive formulation.

The adhesives 56 and 60 are preferably heat curable adhesives and thus contain a thermal cure promoting agent. The thermal cure promoting agent is an alkyl and/or aryl substituted imidazole. Thermal cure agents include, but are not limited to, 2-methyl imidazole, 2-ethyl-4-methylimidazole, 2,4-dimethylimidazole, butylimidazole, 2-heptadecenyl-4-methylimidazole, 2-methylimidazole, 2-undecenylimidazole, 1-vinyl-2-methylimidazole, 2-n-heptadecylimidazole, 2-undecylimidazole, 2-phenylimidazole, 2-ethyl 4-methylimidazole, 1-benzyl-2-methylimidazole, 1-propyl-2-methylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 1-guanaminoethyl-2-methylimidazole, and combinations of two or more of the foregoing. Particularly preferred thermal curing agents include 2-n-heptadecylimidazole and 2-phenylimidazole. The amount of preferred imidazole curing agent in the adhesives 56 and 60 includes a combination of about 10 wt. % 2-n-heptadecylimidazole or less and about 5 wt. % 2-phenylimidazole or less.

In order to provide adhesives 56 and 60 having the desired viscosity and thixotropy index, a viscosity modifier is preferably included in the adhesive formulations. A preferred viscosity modifier is a silica-based material most preferably fumed silica. It is preferred that the fumed silica component be present in an amount of no more than about 15% by weight of the total weight of the formulation. A particularly preferred amount of fumed silica ranges from less than about 5 wt. % to less than about 15% by weight. For the first adhesive 56, the amount of fumed silica preferably ranges from about 2 to about 5 percent by weight based on the total weight of the adhesive formulation. For the second adhesive 60, the amount of fumed silica preferably ranges from about 6 to about 15 percent by weight based on the total weight of the adhesive formulation.

It is preferred that the bead of epoxy encapsulating material 42 be applied to the flexible circuit or TAB circuit 26 (FIG. 2) in an amount which does not extend too far above a plane P defined by the surface of the nozzle plate 20 (FIG. 3). Accordingly, the height of bead 42 above plane P preferably ranges from about 5 to about 10 mils.

After applying the adhesives 56 and 60 to the first surface 58 of the flexible circuit or TAB circuit, preferably as a bead 42 of encapsulant, the adhesives are exposed to heat to cure the adhesives. Cure times may range from about 20 minutes to about 2 hours or longer depending on the cure temperature. A particularly preferred curing temperature for the printhead adhesives is about 110° C. for about 45 minutes to about 1 hour. Because the adhesives 56 and 60 have substantially the same composition, they are miscible with each other and may be cured in a single curing step. Miscibility of the adhesives 56 and 60 also substantially eliminates the problem of delamination between separately cured encapsulant materials applied to the first and second surfaces of the flexible circuit or TAB circuit 26 using conventional methods and encapsulants.

As described above, the chip 36 is preferably attached to the cartridge body and the die attach adhesive 50 is cured after applying the adhesives 56 and 60 to the first surface 58 of the flexible circuit or TAB circuit. However, variations in the steps of the invention may be practiced without departing from the scope of the invention. For example, one or more of the adhesives 38 and 50 may be cured before adhesives 56 and 60 provided the adhesives are susceptible to thermal cure. Regardless of the sequence of curing, the formulations and methods according to the invention are effective to provide enhanced protection against corrosion from inks used in ink jet printer applications.

Having described various aspects and embodiments of the invention and several advantages thereof, it will be recognized by those of ordinary skills that the invention is susceptible to various modifications, substitutions and revisions within the spirit and scope of the appended claims.

What is claimed is:

1. A method for protecting electrical traces on a flexible circuit or TAB circuit and connections between the traces and one or more printheads substrates for an ink jet printhead comprising, applying a first adhesive to a first surface of a flexible circuit attached to a printhead substrate, the first adhesive being a thermally curable epoxy composition having a first viscosity and first thixotropy index, whereby at least a portion of the first adhesive flows past connections between the flexible circuit and the printhead substrate from the first surface of the flexible circuit to a second surface of a flexible circuit, applying a second adhesive to the first surface of the flexible circuit, the second adhesive being a thermally curable epoxy composition that is substantially miscible with the first adhesive and having a second viscosity and second thixotropy index whereby flow of the second adhesive past the connections between the flexible circuit and printhead substrate is substantially inhibited, and thermally curing the first and second adhesives thereby encapsulating portions of the connections and traces for protection against ink corrosion.

2. The method of claim 1 further comprising attaching the printhead substrate and flexible circuit to an ink jet printhead body prior to applying the first and second adhesives to the flexible circuit or TAB circuit.

3. The method of claim 2 wherein excess die attach adhesive is used to attach the printhead substrate to the printhead body, whereby at least a portion of the die attach adhesive flows adjacent side edges of the printhead substrate toward traces and connections.

4. The method of claim 1 wherein the first and second adhesives are applied in a manner sufficient to effectively coat exposed portions of the electrical traces on the flexible circuit.

5. The method of claim 1 wherein the first and second adhesives contain epoxy resins, an imidazole curing agent, and fumed silica viscosity modifier.

6. The method of claim 1 wherein the second adhesive has a Brookfield viscosity at 0.5 rpm that is about three to eight times greater than the viscosity of the first adhesive.

7. The method of claim 6 wherein the thixotropy index of the second adhesive is about 1.5 to 5 times greater than the thixotropy index of the first adhesive.

8. An ink jet printhead for an ink jet printer made by the method of claim 1.

9. The method of claim 1 wherein the second adhesive has a Brookfield viscosity at 0.5 rpm that is about three to eight times greater than the viscosity of the first adhesive, and a thixotropy index that is about 1.5 to about 5 times greater than the thixotropy index of the first adhesive.

10. A printhead for an ink jet printer which comprises a cartridge body containing at least one printhead substrate adhesively attached to the cartridge body and flexible circuit or TAB circuit electrically connected to the printhead substrate, the flexible circuit or TAB circuit containing electrical traces and electrical connections from the traces to bond pads on the printhead substrate, and a thermally cured encapsulant encapsulating the connections and traces, the encapsulant being derived from first and second adhesives, the first adhesive being a thermally curable epoxy composition having a first viscosity and first thixotropy index sufficient for flow of the first adhesive between the connections and traces from a first surface of the flexible circuit or TAB circuit to a second surface of the flexible circuit or TAB circuit, and the second adhesive being a thermally curable epoxy composition miscible with the first adhesive and having a second viscosity and second thixotropy index whereby flow of the second adhesive through the connections and traces is substantially inhibited.

11. The printhead of claim 10 further comprising an ink cartridge containing ink removably attached to the cartridge body.

12. The printhead of claim 10 wherein the encapsulant is derived from first and second adhesives containing a bisphenol-F epoxy resin, amorphous fumed silica, and an imidazole curing agent.

13. The printhead of claim 10 further comprising a die attach adhesive for adhesively attaching the printhead substrate to the printhead body, whereby at least a portion of the die attach adhesive is disposed adjacent side edges of the printhead substrate between the printhead body and the flexible circuit or TAB circuit.

14. The printhead of claim 10 wherein the second adhesive has a Brookfield viscosity at 0.5 rpm that is about three to eight times greater than the viscosity of the first adhesive.

15. The printhead of claim 14 wherein the second adhesive has a thixotropy index that is about 1.5 to about 5 times greater than the thixotropy index of the first adhesive.

16. An ink jet printer containing the printhead of claim 10.

17. A method for encapsulating electrical traces on a flexible circuit or TAB circuit and electrical connections between the flexible circuit or TAB circuit and a printhead substrate to inhibit ink corrosion thereof, comprising applying a first adhesive to a first surface of the flexible circuit or TAB circuit, applying a second adhesive to first surface of the flexible circuit or TAB circuit whereby the first and second adhesives effectively coat exposed portions of the traces and connections on the first surface and on a second surface of the flexible circuit or TAB circuit and wherein the first and second adhesives are thermally curable epoxy compositions that are miscible with each other and the first adhesive has a first viscosity that is lower than a second viscosity of the second adhesive, and curing the first and second adhesives.

18. The method of claim 17 further comprising attaching the printhead substrate and flexible circuit to an ink jet printhead body prior to applying the first and second adhesives to the flexible circuit or TAB circuit.

19. The method of claim 18 wherein the step of attaching the printhead substrate to the printhead body includes applying excess die attach adhesive to the printhead body and pressing the printhead substrate into the die attach adhesive with a force sufficient to cause at least a portion of the die attach adhesive to flow adjacent side edges of the printhead substrate toward traces and connections.

20. The method of claim 17 wherein the first and second adhesives contain epoxy resins, an imidazole curing agent, and fumed silica viscosity modifier.

21. An ink jet printhead for an ink jet printer made by the method of claim 17.

UNITED STATES PATENT AND TRADEMARK OFFICE
CERTIFICATE OF CORRECTION

PATENT NO. : 6,834,937 B2
DATED : December 28, 2004
INVENTOR(S) : Eric Louis Killmeier et al.

It is certified that error appears in the above-identified patent and that said Letters Patent is hereby corrected as shown below:

Column 8,
Line 13, insert -- a -- between "and" and "flexible circuit".
Line 54, insert -- the -- between "to" and "first".

Signed and Sealed this

Twenty-sixth Day of April, 2005

JON W. DUDAS
*Director of the United States Patent and Trademark Office*